US 7,892,513 B2

(12) United States Patent
Fujiwara et al.

(10) Patent No.: US 7,892,513 B2
(45) Date of Patent: Feb. 22, 2011

(54) GROUP III NITRIDE CRYSTAL AND METHOD OF ITS GROWTH

(75) Inventors: Shinsuke Fujiwara, Itami (JP); Hiroaki Yoshida, Itami (JP); Ryu Hirota, Itami (JP); Koji Uematsu, Itami (JP); Haruko Tanaka, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 4 days.

(21) Appl. No.: 12/359,342

(22) Filed: Jan. 26, 2009

(65) Prior Publication Data

US 2010/0189624 A1    Jul. 29, 2010

(51) Int. Cl.
*C01B 21/06* (2006.01)
(52) U.S. Cl. ........................ 423/409; 423/412
(58) Field of Classification Search .................. 423/409, 423/412
See application file for complete search history.

(56) References Cited

U.S. PATENT DOCUMENTS

2008/0303032 A1* 12/2008 Dwilinski et al. ............. 257/76

FOREIGN PATENT DOCUMENTS

| JP | 2002-029897 A | | 1/2002 |
| JP | 2003-206198 A | | 7/2003 |
| JP | 2006-41458 | * | 2/2006 |
| JP | 2007-844435 | * | 4/2007 |
| WO | WO2007/029655 A | * | 3/2007 |

OTHER PUBLICATIONS

M. Bockowski, "Growth and Doping of GaN AlN Single Crystals under High Nitrogen Pressure," Crystal Research & Technology, Aug. 10, 2001, pp. 771-787, vol. 36, Wiley-VCH, Berlin.
H. Yamane et al., "Preparation of GaN Single Crystal Using a Na Flux," Chemistry of Materials, 1997, pp. 413-416, vol. 9, No. 2, American Chemical Society, Washington, DC.

* cited by examiner

*Primary Examiner*—Timothy C Vanoy
*Assistant Examiner*—Michelle Hou
(74) *Attorney, Agent, or Firm*—James W. Judge

(57) ABSTRACT

Affords group III nitride crystal growth methods enabling crystal to be grown in bulk by a liquid-phase technique. One such method of growing group III nitride crystal from solution is provided with: a step of preparing a substrate having a principal face and including at least on its principal-face side a group III nitride seed crystal having the same chemical composition as the group III nitride crystal, and whose average density of threading dislocations along the principal face being $5 \times 10^6$ cm$^{-2}$ or less; and a step of bringing into contact with the principal face of the substrate a solution in which a nitrogen-containing gas is dissolved into a group III metal-containing solvent, to grow group III nitride crystal onto the principal face.

14 Claims, 3 Drawing Sheets

GROUP III NITRIDE CRYSTAL AND METHOD OF ITS GROWTH

BACKGROUND OF THE INVENTION

1. Technical Field

The present invention relates to methods of growing group III nitride crystals by a liquid-phase technique, and to group III nitride crystals produced by the growth methods.

2. Description of the Related Art

Group III nitride crystals are widely employed as wafers or similar substrates for various semiconductor devices. Bulk group III nitride crystals have been sought in recent years for the sake of manufacturing the various semiconductor devices efficiently.

Methods of growing group III nitride crystals include vapor-phase techniques such as hydride vapor phase epitaxy (HVPE) and metalorganic chemical vapor deposition (MOCVD), and liquid-phase techniques such as high-pressure solution growth and flux growth. Compared with vapor-phase techniques, liquid-phase techniques are superior from an environmental protection aspect, because toxic gases are not employed in the crystal growth.

For example, M. Bockowski, "Growth and Doping of GaN and AlN Single Crystals under High Nitrogen Pressure," *Crystal Research &Technology*, Vol. 36, Issue 8-10, 2001, pp. 771-787 (Non-patent Document 1) discloses, as a method of growing group III nitride crystal by a liquid-phase technique, a GaN crystal growth method by high-pressure solution growth. Likewise, H. Yamane, et al., "Preparation of GaN Single Crystals Using a Na Flux," *Chemistry of Materials*, Vol. 9, No. 2, 1997, pp. 413-416 (Non-patent Document 2) discloses a method of growing GaN crystal by an Na-flux technique. Additionally, Japanese Unexamined Pat. App. Pub. No. 2003-206198 (Patent Document 1) discloses a method of growing GaN crystal by an Na-flux technique, employing platelike group III nitride seed crystals.

Owing to its crystal-growth conditions being a high 1 GPa in pressure and a high 1500° C. in temperature, the growth method disclosed in the *Crystal Research &Technology* article (Non-patent Document 1) raises the crystal manufacturing costs, and the fact that the method does not employ seed crystals is prohibitive of growing bulk crystal. Meanwhile, although the crystal-growth conditions for the growth method disclosed in the *Chemistry of Materials* article (Non-patent Document 2) are, at 800° C. and 10 Mpa, relatively easy to implement, because seed crystals are not employed in that case as well, growing bulk crystal is challenging. Furthermore with regard to the growth method disclosed in the *Crystal Research & Technology* article (Patent Document 1), inasmuch as the diametric span of the platelike seed crystal that is employed is not large, bulk crystal cannot be obtained.

As mentioned earlier, group III nitride crystal can be grown by liquid-phase methods such as high-pressure solution growth and flux techniques. For example, onto a platelike group III nitride seed-crystal substrate of large diametric span, a group III nitride crystal having the same chemical composition as the substrate can be homoepitaxially grown. With this procedure, nevertheless, cracking occurs in the substrate and in the group III nitride crystal grown onto the substrate, which is prohibitive of producing bulk group III nitride crystal substrates.

BRIEF SUMMARY OF THE INVENTION

An object of the present invention is to make available a group III nitride crystal growth method that enables bulk crystal to be grown employing a liquid-phase technique.

The present inventors made detailed studies as to the cause of cracking in such substrates and group III nitride crystals. As a result, they discovered a correlation between cracking in the substrates and group III nitride crystals, and the substrate's dislocation density. Following the study, the inventors also discovered that in liquid-growth-based homoepitaxial deposition of group III nitride crystal onto a substrate, having the average density of threading dislocations in the substrate principal face be $5\times10^6$ cm$^{-2}$ or less, preferably to $1\times10^6$ cm$^{-2}$ or less, curbs cracking in the substrate and group III nitride crystal grown onto the substrate, making the growth of bulk group III nitride crystal possible.

One aspect of the present invention is a method of growing group III nitride crystal by a liquid-phase technique, the group III nitride crystal growth method being provided with: a step of preparing a substrate having a principal face and including at least on its principal-face side a group III nitride seed crystal having the same chemical composition as the group III nitride crystal, and whose average density of threading dislocations along the principal face is $5\times10^6$ cm$^{-2}$ or less; and a step of bringing into contact with the substrate principal face a solution in which a nitrogen-containing gas is dissolved into a group III metal-containing solvent, to grow group III nitride crystal onto the principal face. In this case, it is possible to have the average density of threading dislocations along the crystal-growth plane of the group III nitride crystal in the group III nitride crystal growth step be $5\times10^6$ cm$^{-2}$ or less.

In another embodiment mode of the present invention, it is possible to have the average density of threading dislocations along the principal face be $1\times10^6$ cm$^{-2}$ or less. In this implementation, the threading-dislocation average density along the crystal-growth plane of the group III nitride crystal in the group III nitride crystal growth step can be $1\times10^6$ cm$^{-2}$ or less.

In a further embodiment mode of the present invention, it is possible to have the number of threading dislocations in an arbitrary first square region, 30 µm to a side, within the substrate principal face be 200 or less, and furthermore 50 or less. Likewise, it is possible to have the number of threading dislocations in an arbitrary second square region, 30 µm to a side, within the crystal-growth plane of the group III nitride crystal be 200 or less, and furthermore 50 or less.

In yet another embodiment mode of the present invention, it is possible to have the substrate be a freestanding substrate the entirety of which is formed from a group III nitride seed crystal. It is also possible to have the surface area of the substrate principal face be 1 cm$^2$ or more. Additionally, the group III nitride crystal that is grown can be GaN crystal. In such implementations the solvent can be metallic Ga whose purity is 99 mass % or greater.

The present invention in another aspect is group III nitride crystal grown according to a foregoing growth method.

According to the present invention, bulk group III nitride crystal can be grown by a liquid-phase technique.

From the following detailed description in conjunction with the accompanying drawings, the foregoing and other objects, features, aspects and advantages of the present invention will become readily apparent to those skilled in the art.

EXPLANATION OF REFERENCES

1: substrate; 1a: group III nitride seed crystal; 1b: under-substrate; 1m: principal face; 1p: first square regions; 3: solvent; 5: nitrogen-containing gas; 7: pressurizing gas; 10: group III nitride crystal; 10a, 10b, 10m: crystal-growth planes; 10p: second square regions; 21: inner vessel; 23: crystal-growth vessel; 25: heater; 27: heat insulator; 29: outer vessel; 31: nitrogen-containing gas supply device; 33: pressurizing gas supplying device; 35: evacuation pump; 41: first supply line; 41a, 43a: sections to the inner-vessel side of the valves; 41b: section to the nitrogen-containing gas supply device side of the valve; 41p, 43p: pressure gauges; 41v, 43v, 45v, 47v: valves; 43: second supply line; 43b: section to the nitrogen-containing gas supply device side of the valve; 45: third supply line; 45a: section to the outer-vessel side of the valve; 45b: section to the evacuation pump side of the valve; 47: fourth supply line.

Embodiment Mode 1

Figure 1:
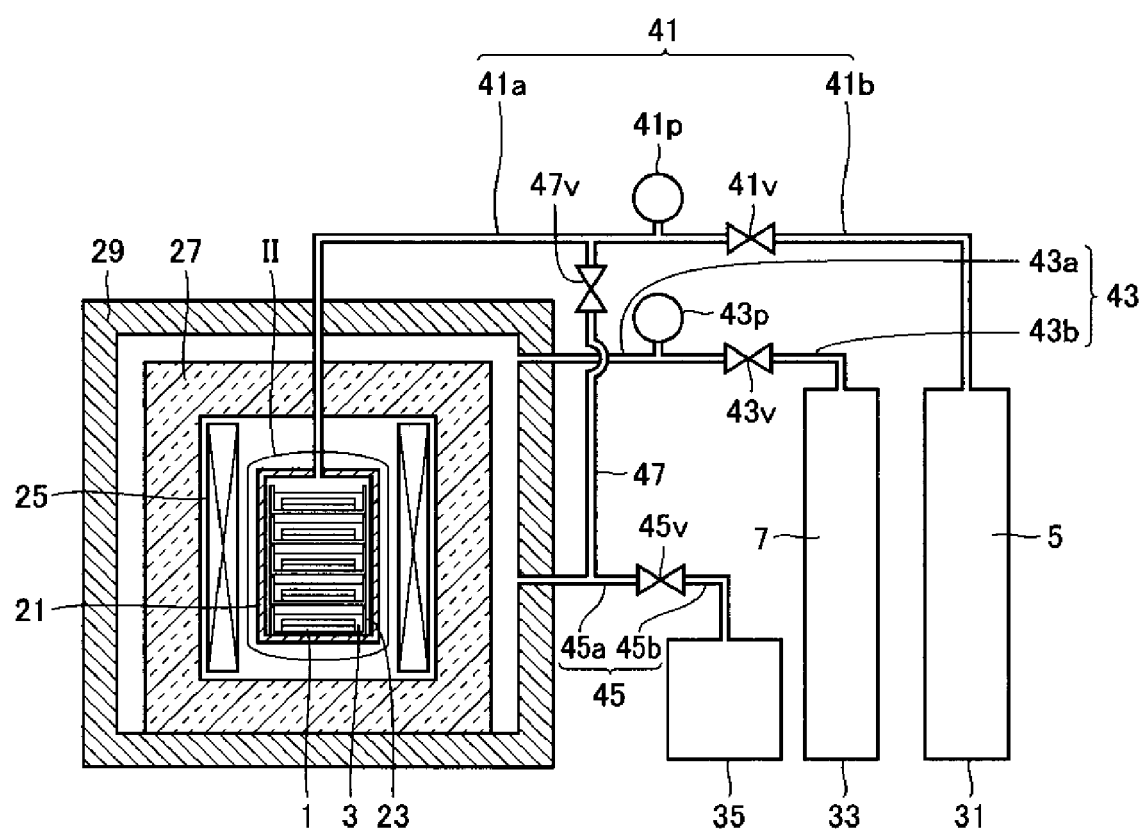
FIG. 1 is an outline sectional view illustrating one embodiment mode of a group III nitride crystal growth method and growth apparatus involving the present invention.
Figure 2:
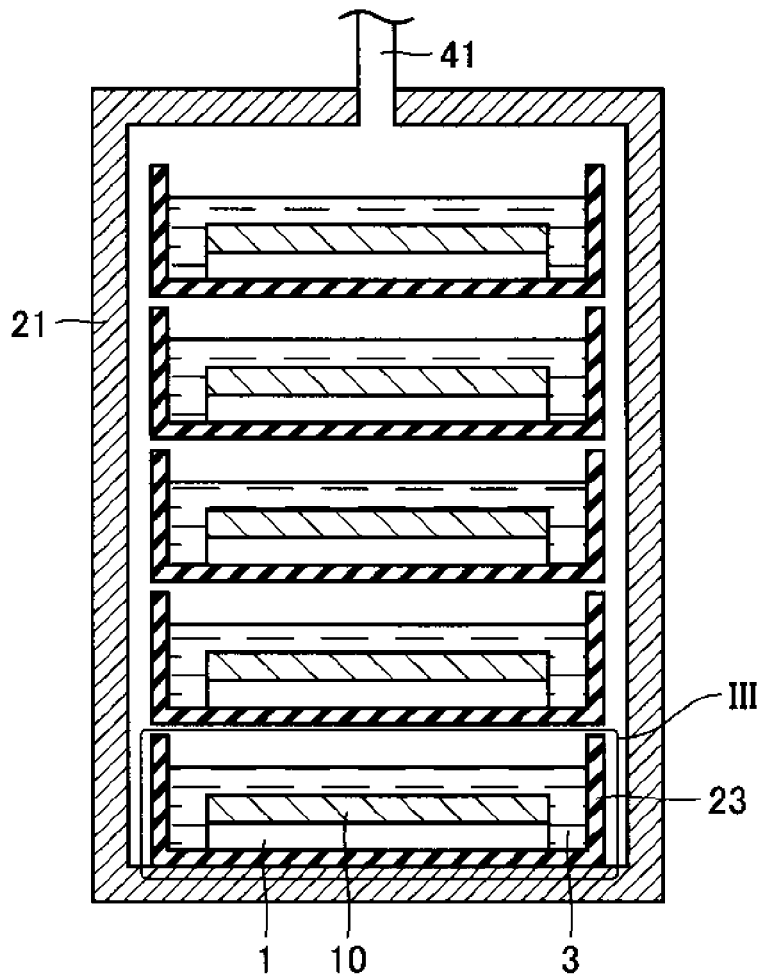
FIG. 2 is an outline sectional view enlarging section II from FIG. 1.
Figure 3:
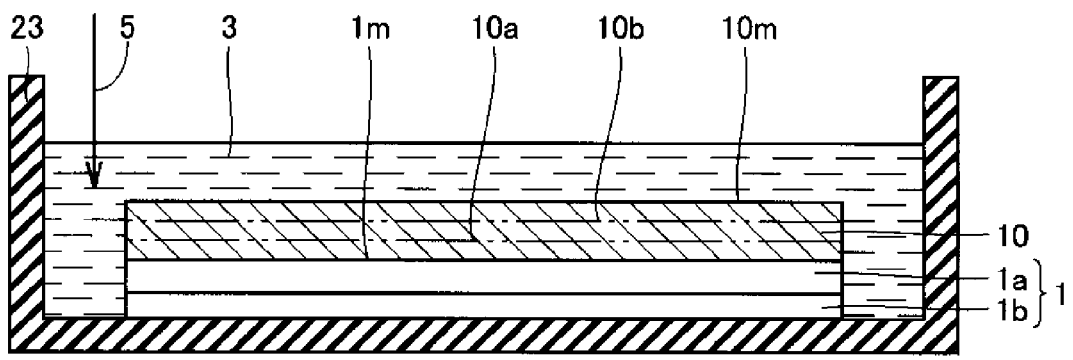
FIG. 3 is an outline sectional view enlarging section group III from FIG. 2.

Referring to FIGS. 1 through 3, an explanation of the present invention will be made. One embodiment mode of a group III nitride crystal growth method involving the present invention is a method of growing a group III nitride crystal 10 from solution, the growth method being provided with: a step of preparing a substrate 1 having a principal face 1m and including at least on its principal-face 1m side a group III nitride seed crystal 1a having the same chemical composition as the group III nitride crystal 10, and whose average density of threading dislocations along the principal face 1m is $5 \times 10^6$ cm$^{-2}$ or less; and a step of bringing into contact with the principal face 1m of the substrate 1a solution in which a nitrogen-containing gas 5 is dissolved into a group III metal-containing solvent 3, to grow the group III nitride crystal 10 onto the principal face 1m.

In the group III nitride crystal growth method of the present embodiment mode, a substrate in which average density of threading dislocations along the substrate principal face 1m is $5 \times 10^6$ cm$^{-2}$ or less is prepared. Onto the substrate principal face 1m, the group III nitride crystal 10 is homoepitaxially grown. With this growth method, cracking in a substrate and cracking in Group III nitride crystal grown onto the substrate can be minimized, and consequently bulk crystal can be grown.

FIGS. 1 and 2 illustrate a growth system employed in the Group III nitride crystal growth method of the present embodiment mode. The system is provided with: an outer vessel 29; a heat insulator 27 arranged inside the outer vessel 29; a heater 25 arranged disposed inside the heat insulator 27; and an inner vessel 21 arranged inside the heater 25. Within the inner vessel 21, crystal-growth vessels 23 are arranged. Group III nitride crystal 10 can be grown in the crystal-growth vessel 23. The material for the crystal-growth vessels 23 is not particularly limited as long as it does not react with the solvent 3 and the nitrogen-containing gas 5, and is high in mechanical strength and heat resistance, but boron nitrides (BN) are preferable. Furthermore, the material for the inner vessel 21 is not particularly limited as long as it is high in mechanical strength and heat resistance, but stainless steels and heat-resistant steels, for example, are preferable. Additionally, the material for the outer vessel 29 is not particularly limited as long as it is high in mechanical strength and heat resistance, but stainless steels are preferable, for example. Also, the material for the heat insulator 27 is not particularly limited as long as it is high in mechanical strength and heat resistance, but wool graphite is preferable, for example.

The growth system employed in the present embodiment mode is also provided with: a nitrogen-containing gas supply device 31 connected to the inner vessel 21 by a first supply line 41; a pressurizing gas supplying device 33 connected to the outer vessel 29 by a second supply line 43; and a evacuation pump 35 connected to the outer vessel 29 by a third supply line 45. The first supply line 41 is furnished with a valve 41v for adjusting flow rate of supply of the nitrogen-containing gas 5. The section 41a to the inner-vessel 21 side of the valve 41v is provided with a first pressure gauge 41p. Furthermore, the second supply line 43 is furnished with a valve 43v for adjusting flow rate of supply of the pressurizing gas 7. The section 43a to the outer-vessel 29 side of the valve 43v is provided with a second pressure gauge 43p. Also, the third supply line 45 is furnished with a valve 45v for adjusting exhaust flow rate.

The growth system is additionally provided with a fourth supply line 47. The line 47 connects the section 41a to the inner-vessel 21 side of the valve 41v in the first supply line 41 and the section 45a to the outer-vessel 29 side of the valve 45v in the third supply line 45. The fourth supply line 47 is provided with a valve 47v. It should be understood that in FIG. 1, for reference, the section 41b to the nitrogen-containing gas supply device 31 side of the valve 41v in the first supply line 41, the section 43b to the pressurizing gas supplying device 33 the side of valve 43v in the second supply line 43, and the section 45b to the evacuation pump 35 the side of valve 45v in the third supply line 45 are also illustrated.

Referring to FIGS. 1 through 3, a group III nitride crystal growth method of the present embodiment mode will be explained. The group III nitride crystal growth method of the present embodiment mode is provided with a step of initially preparing a substrate (substrate preparing step). The substrate has a principal face 1m, and includes at least on its principal-face side 1m a group III nitride seed crystal 1a having the same chemical composition as the group III nitride crystal 10, and whose average density of threading dislocations along the principal face 1m is $5 \times 10^6$ cm$^{-2}$ or less.

A substrate 1 prepared in the present embodiment mode has a principal face 1m. The principal face 1m may be formed by at least one method selected from planarizing methods such as grinding, polishing, and etching. The planar principal face facilitates epitaxial growth of group III nitride crystal onto the principal face. A substrate 1 having a non-planar principal face may also be used for this invention.

Furthermore, the substrate 1 includes at least the principal-face 1m side a group III nitride seed crystal 1a having the same chemical composition as a group III nitride crystal 10. In the substrate 1, the group III nitride crystal 10 can be homoepitaxially grown onto the substrate principal face 1m. In the present embodiment mode, the material for the substrate 1 is not particularly limited as long as the substrate has at least on its principal-face 1m side a group III nitride seed crystal whose chemical composition is the same as a group III nitride crystal to be grown. Examples of such substrates include template substrates in which a group III nitride seed crystal 1a is formed onto an undersubstrate 1b, and freestanding substrates the entirety of which is formed from the group III nitride seed crystal 1a. For instance, in the situation in which an $Al_xGa_yIn_{1-x-y}N$ crystal ($0 \leq x$, $0 \leq y$, $x+y \leq 1$) is homoepitaxially grown as the group III nitride crystal 10, an $Al_xGa_yIn_{1-x-y}N$ seed crystal ($0 \leq x, 0 \leq y, x+y \leq 1$) is utilized as the group III nitride seed crystal 1a in the substrate 1.

Furthermore, in the substrate 1, the average density of threading dislocations along the principal face 1m is $5 \times 10^6$ $cm^{-2}$ or less. Herein, "threading dislocations along the principal face" means dislocations passing through the principal face, appearing on the principal face in the form of dots. Also, "average density" means average density along the principal face.

Figure 4:
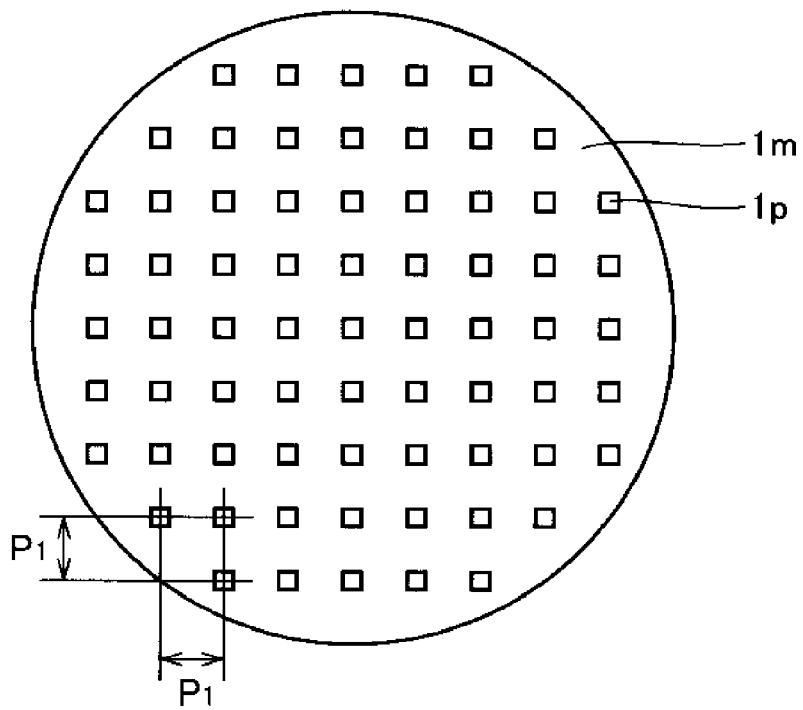
FIG. 4 is an outline plan view representing the principal face of a substrate and a plurality of first square regions arrayed within the principal face.

In the present embodiment mode, the average density of threading dislocations along the principal face 1m of the substrate 1 is determined by cathodoluminescence (CL) measurement of dark spot density. As illustrated in FIG. 4, regions in which the measurement is carried out are first 30 μm-square regions 1p. The first square regions 1p are arranged at a regular pitch of $P_1$ within the principal face 1m of the substrate 1. Accordingly, averaging of dark spot densities measured by cathodoluminescence (CL) in all of the first square regions 1p within the principal face 1m produces the average density of threading dislocations along the principal face 1m of the substrate 1.

A substrate 1 in which average density of threading dislocations along the principal face 1m is $5 \times 10^6$ $cm^{-2}$ or less has less inner strain. Because cracking in the substrate and cracking in group III nitride crystal homoepitaxially grown onto the substrate principal face can thus be controlled, it follows that crystal can be obtained in bulk. From the perspective of lessening the inner strain in the substrate 1 to further restrain cracking in the substrate and cracking in the group III nitride crystal grown onto the substrate, the average density of threading dislocations along the principal face 1m is preferably $1 \times 10^6$ $cm^{-2}$ or less.

Furthermore, in the present embodiment mode, the number of threading dislocations in an arbitrary first square region 1p within the principal face 1m of the substrate 1 is preferably 200 or less. Specifically, in a plurality of first square regions 1p arrayed within the principal face 1m of the substrate 1, the number of threading dislocations in each of the first square regions 1p is preferably 200 or less. While substrates and group III nitride crystal grown onto the substrates do not crack if the average density of threading dislocations along the substrate principal face 1m is $5 \times 10^6$ $cm^{-2}$ or less, if a first square region in which the number of threading dislocations exceeds 200 is present within the principal face 1m, localized cracking is prone to occur in the first square region and in group III nitride crystal region grown onto the first square region. Bringing the number of threading dislocations in an arbitrary first square region to 200 or less makes it possible to control localized cracking as well. From the perspective of preventing the localized cracking from occurring, the number of threading dislocations in an arbitrary first square region within the principal face 1m of the substrate 1, that is, the number of threading dislocations in each of the first square regions, is preferably 50 or less.

Additionally, the material for the substrate 1 is not particularly limited as long as on its principal face 1m side it has a group III nitride seed crystal having the same chemical composition as a group III nitride crystal to be grown, and examples of the substrate include template substrates in which a group III nitride seed crystal 1a is formed onto an undersubstrate 1b, and freestanding substrates the entirety of which is formed from the group III nitride seed crystal 1a. In crystal growth by a liquid-phase technique in the present embodiment mode, a freestanding substrate the entirety of which is formed from the group III nitride seed crystal 1a is preferably utilized as a substrate. Employing the growth method of the present embodiment mode curbs cracks occurring in such a substrate and group III nitride crystal grown onto the substrate. From that perspective, in implementations in which a freestanding substrate the entirety of which is formed from the group III nitride seed crystal 1a is employed as the substrate, the serviceability of the growth method of the present embodiment mode is enhanced.

Furthermore, the area of the principal face 1m of the substrate 1 is not particularly limited, but the area is preferably 1 $cm^2$ or more, and is more preferably 10 $cm^2$ or more. Whereas in conventional crystal growth by a liquid-phase technique, the larger the principal-face surface area of the substrate is, the more liable the substrate and grown crystal are to crack, in crystal growth by a growth method of the present embodiment mode, cracking in the substrate and cracking in crystal grown onto the substrate are controlled to a minimum even if the principal-face surface area is large. From that perspective, the greater the principal-face surface area of the substrate, the more enhanced will be the serviceability of a growth method of the present embodiment mode.

A substrate 1 prepared in the present embodiment mode is not particularly limited as long as it has a principal face 1m, and includes at least on the principal-face 1m side a group III nitride seed crystal 1a having at least the same chemical composition as a group III nitride crystal 10, and whose average density of threading dislocations along the principal face 1m is $5 \times 10^6$ $cm^{-2}$ or less. Furthermore, advantageously, the group III nitride seed crystal 1a of the substrate 1 may be a seed crystal grown by any method such as vapor-phase techniques including HVPE and MOCVD, and liquid-phase techniques including solution growth and flux growth.

In the substrate preparing step, a substrate formed by any method may be prepared. This step, however, is of significance in that the substrate 1 having the principal face 1m and including at least the principal-face 1m side the group III nitride seed crystal 1a having the same chemical composition as the group III nitride crystal 10, with the average density of threading dislocations along the principal face 1m being $5 \times 10^6$ $cm^{-2}$ or less is selected as a substrate for growing a group III nitride crystal by a liquid-phase technique.

The group III nitride crystal growth method of the present embodiment mode is provided with a step of next bringing into contact with the principal face of the substrate 1a solution in which a nitrogen-containing gas 5 is dissolved into a group III metal-containing solvent 3, to grow the group III nitride crystal 10 onto the principal face 1m (group III nitride crystal growth step). Below, the group III nitride crystal growth step will be more specifically explained, referring to FIGS. 1 through 3.

The group III nitride crystal growth step is carried out through the following plurality of sub-steps. First, a substrate 1 is placed on the bottom of a crystal-growth vessel 23 with the substrate principal face 1m facing up (substrate placing sub-step). The crystal-growth vessel 23 is not particularly limited, but from the perspective of heat resistance, a boron nitride (BN) crucible is preferably employed. The substrate 1 includes at least on its principal-face 1m side a group III nitride seed crystal 1a having the same chemical composition as a group III nitride crystal 10.

Next, a group III metal-containing solvent 3 is fed into the crystal-growth vessel 23 in which the substrate 1 is placed (solvent feeding sub-step). The solvent 3 is solid at room temperature (at approximately 25° C.), but is liquefied by subsequent heating. The group III metal-containing solvent 3 is not limited, but a solvent containing group III metal of high purity is preferable. Such a group III metal enables growing group III nitride crystal of high purity. For example, in order to grown GaN crystal of high purity, metallic Ga of high purity is preferably employed. If such metallic Ga is employed, it preferably has a purity of 99 mass % or greater, and more preferably has a purity of 99.999 mass % or greater. Herein, the amount of the group III metal-containing solvent 3 is not particularly limited, but an amount sufficient for the liquefied solvent 3 (molten solvent) to cover the principal face 1m of the substrate 1 is preferable. Specifically, is it desirable that the depth from the level of the liquefied solvent 3 to the principal face 1m is between 1 mm and 50 mm inclusive. That is because if the distance is less than 1 mm, there is a possibility that the (molten) solvent 3 will not cover the entire surface of a substrate due to surface tension of the (molten) solvent 3, and because if the distance is more than 50 mm, supply of nitrogen from the surface of the (molten) solvent 3 is insufficient.

Subsequently, the crystal-growth vessel 23 in which the substrate 1 and group III metal-containing solvent 3 are housed is arranged in an inner vessel 21 (crystal-growth vessel arranging sub-step). In FIGS. 1 and 2, for example, five crystal-growth vessels 23 are arranged. Arranging the plurality of crystal-growth vessels 23 in the inner vessel 21 makes it possible to grow a plurality of group III nitride crystals 10 at a time.

Next, with an evacuation pump 35, interiors of the inner vessel 21 and an outer vessel 29 are evacuated (evacuation sub-step). This step is for removing impurities inside the inner vessel 21 and outer vessel 29. In the evacuation, valves 41v and 43v are closed, with valves 47v and 45v being opened. The degree of vacuum in the inner vessel 21 and outer vessel 29 after the evacuation is not particularly limited, but is preferably 1 Pa or less. At this degree of vacuum, residual impurities can be reduced.

Subsequently, a nitrogen-containing gas 5 and a gas 7 for pressurizing are supplied respectively to the insides of the inner vessel 21 and outer vessel 29 so that the internal pressure in each vessel is brought to between 1 MPa and 10 MPa inclusive (nitrogen-containing gas supplying sub-step). In this step, the nitrogen-containing gas 5 supplied to the interior of the inner vessel 21 is not particularly limited, but a gas containing nitrogen of high purity is preferably employed. Such a gas is advantageous because it enables growing group III nitride crystal of high purity. For the same reason, as the nitrogen-containing gas 5, a nitrogen gas having a purity of 99.999 mol % or more is preferable. On the other hand, the pressurizing gas 7 supplied to the outer vessel 29 may not be a nitrogen-containing gas because it is used to maintain pressure inside the outer vessel 29, and not to grow group III nitride crystal. Inside the outer vessel 29, however, a heater 25 is disposed, and thus an inert gas that does not cause a reaction due to the heater 25, such as a nitrogen gas and an argon gas, is preferably utilized as the pressurizing gas 7.

Next, with the heater 25, the interiors of the inner vessel 21 and outer vessel 29 are heated to bring temperature in the entire interior of the inner vessel 21 to between 800° C. and 1000° C. inclusive (heating sub-step). As a result of the heating, the group III metal-containing solvent 3 fed in the inner vessel 21 is converted from a solid to a liquid (melt), and the (molten) solvent 3 covers the principal face 1m of the substrate 1. Furthermore, the nitrogen-containing gas 5 is dissolved into the (molten) solvent 3. In this manner, the solution in which the nitrogen-containing gas 5 is dissolved into the group III metal-containing solvent 3 is made contact with the principal face 1m of the substrate 1. Herein, the heater 25 is not particularly limited as long as it is suited to heat the insides of the inner vessel 21 and outer vessel 29, but a resistive heater is preferably employed. Such a heater makes it possible to readily control temperature distributions inside the inner and outer vessels.

During the heating sub-step, the nitrogen-containing gas 5 is further supplied to the inner vessel 21 to make the internal pressure in the inner vessel 21 greater than that in the outer vessel 29. The difference between the two internal pressures is in the range of from 0.01 MPa to 0.1 MPa inclusive. That is, the nitrogen-containing gas 5 is supplied so that 0.01 MPa≦{(inner-vessel internal pressure) (outer-vessel internal pressure)}≦0.1 MPa is established. That is because the pressurizing gas 7 in the outer vessel 29 is prevented from entering into the inner vessel 21 to keep the nitrogen purity in the inner vessel 21 high.

Next, the amount of the nitrogen-containing gas 5 supplied to the inner vessel 21 and the amount of heating by the heater 25 are adjusted. Specifically, with the temperature in the entire interior of the inner vessel 21 being kept between 800° C. to 1000° C. inclusive, the internal pressure in the inner vessel 21 is brought to 1 MPa to 10 MPa inclusive to grow the group III nitride crystal 10 onto the principal face 10m of the substrate 1 for the predetermined period of time (crystal growth sub-step). During the growth, the amount of the pressurizing gas 7 supplied to the outer vessel 29 is adjusted to make the internal pressure in the outer vessel 29 lower in the range of from 0.01 MPa to 0.1 MPa inclusive, compared with the internal pressure in the inner vessel 21. That is, the adjustment is carried out so that 0.01 MPa≦{(inner-vessel internal pressure)−(outer-vessel internal pressure)}≦0.1 MPa is established also in the crystal growth, as in the heating.

Subsequently, with the relationship of 0.01 MPa≦{(inner-vessel internal pressure)−(outer-vessel internal pressure)}≦0.1 MPa being maintained, the insides of the inner vessel 21 and outer vessel 29 are each cooled and depressurized to take out the group III nitride crystal 10 grown onto the substrate 1 from the crystal-growth vessel 23 in the inner vessel 21 (crystal withdrawal sub-step).

In the present embodiment mode, the group III nitride crystal 10 is produced through the step of growing the group III nitride crystal 10 onto the principal face 1m of the substrate 1 in which average density of threading dislocations along the principal face 1m is $5 \times 10^6$ cm$^{-2}$ or less. Average density of threading dislocation on crystal-growth planes 10a, 10b, and 10m of the group III nitride crystal 10 is preferably brought to $5 \times 10^6$ cm$^{-2}$ or less. Furthermore, in the step of growing the group III nitride crystal 10 onto the principal face 1m of the substrate 1 in which the average density of threading dislocations along the principal face 1m is $1 \times 10^6$ cm$^{-2}$ or less, the average density of threading dislocation on the crystal-growth planes 10a, 10b, and 10m of the group III nitride crystal 10 is preferably brought to $1 \times 10^6$ cm$^{-2}$ or less.

Herein, "threading dislocations on the crystal-growth planes 10a, 10b, and 10m of the group III nitride crystal 10" means dislocations passing through the crystal-growth planes 10a, 10b, and 10m. The dislocations appear on the crystal-growth planes 10a, 10b, and 10m in the form of dots. Furthermore, average density means average density on the crystal-growth planes 10a, 10b, and 10m. Additionally, the crystal-growth planes 10a, 10b, and 10m are planes appearing in a crystal growth process, and include the crystal-growth planes 10a and 10b during the crystal growth and the crystal-growth plane 10m after the crystal growth. Generally, the direction in which crystal grows is substantially perpendicular to the principal face of a substrate. Therefore, the crystal-growth planes 10a, 10b, and 10m each substantially parallel the principal face 1m of the substrate 1.

Figure 5:
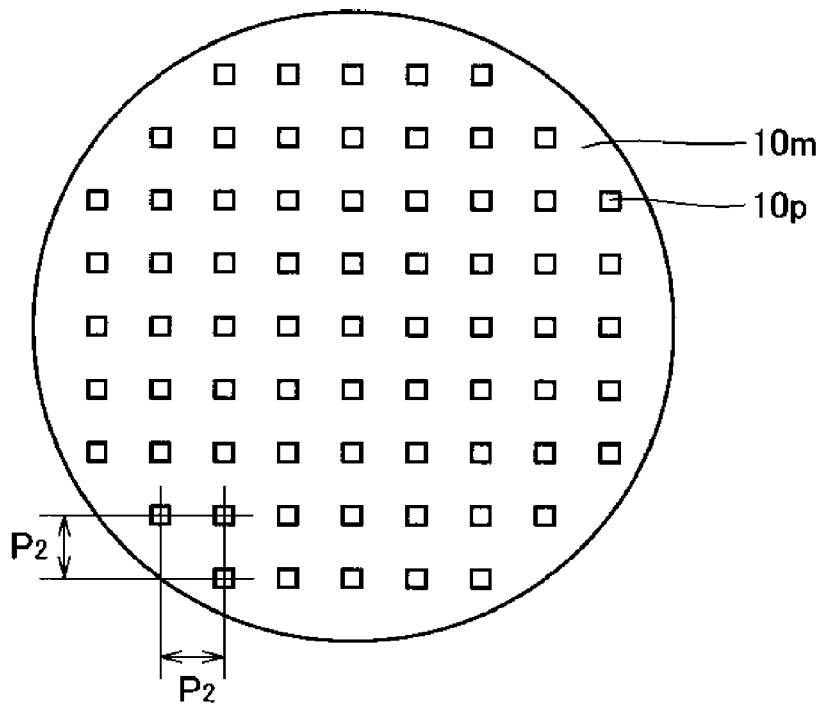
FIG. 5 is an outline plan view representing the crystal-growth plane of a group III nitride crystal and a plurality of second square regions arrayed within the crystal-growth plane.

In the present embodiment mode, the average density of threading dislocation on the crystal-growth planes 10a, 10b, and 10m of the group III nitride crystal 10 is determined by cathodoluminescence (CL) measurement of dark spot density, as in the determination of the average density of threading dislocations along the principal face 1m of the substrate 1. As illustrated in FIG. 5, regions in which the measurement is carried out are second 30 μm-square regions 10p. The second square regions 10p are arranged at a regular pitch of $P_2$ within the crystal-growth plane 10m of the group III nitride crystal 10. Accordingly, averaging of dark spot densities measured by cathodoluminescence (CL) in all of the second square regions within the crystal-growth plane 10m produces the average density of threading dislocation on the crystal-growth plane 10m of the group III nitride crystal 10. Herein, in FIG. 5, the crystal-growth plane 10m after the crystal growth is illustrated, and the crystal-growth planes 10a and 10b during the crystal growth are the same as in the crystal-growth 10m.

That is, the step of growing the group III nitride crystal 10 onto the principal face 10 nm of the substrate 1 is preferably carried out without making the average density of threading dislocation on the crystal-growth planes 10a, 10b, and 10m greater, compared with the average density of threading dislocations along the principal face 1m of the substrate 1. Herein, in what not increasing dislocation density means, it is included that in crystal growth, dislocations are prevented from occurring, as well as that if dislocations occur, they disappear. Herein, in crystal growth, dislocations propagate in the same direction as the direction in which crystal grows. Therefore, threading dislocations on the principal face of a substrate propagate as threading dislocations on a crystal-growth plane of the crystal. Carrying out crystal growth without increasing density of threading dislocations along the principal face of a substrate results in that density of threading dislocation on a crystal-growth plane of the crystal is the same as, or smaller than, the density of threading dislocation on the substrate principal face.

Furthermore, in the present embodiment mode, crystal growth is preferably carried out so that the number of threading dislocations in any second square region 10p on the crystal-growth planes 10a, 10b and 10m of the group III nitride crystal 10 is 200 or less. That is, in the plurality of second square regions 10p arranged within the crystal-growth planes 10a, 10b and 10m of the group III nitride crystal 10, the number of threading dislocations in each of the second square regions 10p is preferably 200 or less. A substrate and a group III nitride crystal grown onto the substrate never break if average density of threading dislocation on the crystal-growth planes 10a, 10b and 10m is $5\times10^6$ cm$^{-2}$ or less. With a second square region in which the number of threading dislocations exceeds 200 being present within the crystal-growth planes 10a, 10b and 10m, however, local cracking is prone to occur in the second square region. Bringing the number of threading dislocations in any second square region to 200 or less can curb even the local cracking. From the perspective of preventing the local cracking from occurring, the number of threading dislocations in any second square region within the crystal-growth planes 10a, 10b and 10m of the group III nitride crystal 10, that is, the number of threading dislocations in each of the second square regions 10p, is preferably 50 or less.

The method of carrying out the group III nitride crystal growth of the present embodiment mode is not particularly limited. But, if crystal growth is carried out by solution techniques as in the present embodiment mode, it is desirable that crystal-growth rate is not made too much fast. That is because if crystal-growth rate is made too much fast, there is a possibility that the average density of threading dislocation on the crystal-growth planes 10a, 10b and 10m is made greater, compared with the average density of threading dislocation on the major plane 1m of the substrate 1, or that the number of threading dislocations in any second square region on the crystal-growth planes 10a, 10b and 10m exceeds 200. The crystal-growth rate on the upper limit preventing dislocations to occur depends principally on crystal-growth temperature, and with the crystal-growth temperature being between 800° C. and 1000° C. inclusive, the crystal-growth rate is preferably brought to 1 μm/hr or less. Carrying out homoepitaxial growth at a low crystal-growth rate of 1 μm/hr or less curbs dislocation occurrence during the crystal growth, leading to a tendency for dislocation that has occurred to disappear. In the growth method of the present embodiment mode, under the conditions that crystal-growth temperature (temperature in inner vessel) is between 800° C. and 1000° C. inclusive, and crystal-growth pressure (pressure in inner vessel) is between 1 MPa and 10 MPa inclusive, if the group III metal (such as metallic Ga) in the solvent 3 is not added with a substance prompting the crystal growth, such as metal Na and metal Li, the crystal-growth rate is brought to 1 μm/hr or less.

Embodiment Mode 2

One embodiment mode of a group III nitride crystal involving the present invention is produced by the growth method of Embodiment Mode 1 (cf. FIG. 3). Being grown by the growth method of Embodiment Mode 1, a group III nitride crystal 10 of the present embodiment mode is a bulk crystal. Furthermore, utilizing group III metal and nitrogen-containing gas of high purity as precursors makes the group III nitride crystal 10 a group III nitride crystal of high purity.

EMBODIMENTS

1. Substrate Preparation

As substrates 1, a plurality of 2 inches (50.8 mm)-diameter, 350 μm-thick freestanding GaN substrates fabricated by HVPE, and whose principal faces 1m were polished planar (0001) Ga faces were prepared. As a result of X-ray diffraction measurement, a center part of the principal faces had an off-axis angle of 0.5° or less with respect to the (0001) plane. From the plurality of GaN substrates, 10 GaN substrates in which average density of threading dislocation on their principal faces was from more than $5\times10^6$ cm$^{-2}$ to $1\times10^7$ cm$^{-2}$ or less, 10 GaN substrates in which average density of threading dislocation on their principal faces was from more than $1\times10^6$ cm$^{-2}$ to $5\times10^6$ cm$^{-2}$ or less, and 10 GaN substrates in which average density of threading dislocation on their principal faces was $1\times10^6$ cm$^{-2}$ or less were each sorted out.

Herein, referring to FIG. 4, the average densities of threading dislocation on the GaN substrate principal faces were determined by carrying out cathodoluminescence (CL) measurement of dark-spot densities in 69 first 30 μm-square regions arranged on grid points with pitch $P_1$ of 5 mm within the principal faces $1m$ to average the dark-spot densities.

Below, an example of employing a GaN substrate in which average density $D_s$ of threading dislocation on its principal face is $5 \times 10^6 \text{ cm}^{-2} < D_s \leq 1 \times 10^7 \text{ cm}^{-2}$ to grow a GaN crystal is called Comparative Example 1, an example of employing a GaN substrate in which $1 \times 10^6 \text{ cm}^{-2} < D_s \leq 5 \times 10^6 \text{ cm}^{-2}$ to grow a GaN crystal is termed Embodiment 1, and an example of employing a GaN substrate in which $D_s \leq 1 \times 10^6 \text{ cm}^{-2}$ to grow a GaN crystal is termed Embodiment 2.

2. GaN Crystal Growth

Referring to FIG. 3, each of the above GaN substrates (substrates 1) was placed on the bottom of a BN crucible (crystal-growth vessel 23) having inner diameter of 60 mm and depth of 20 mm with the substrate planar principal face $1m$ facing up. Next, 100 g metallic Ga (solvent 3) with purity of 99.9999% by mass was fed into the BN crucible (crystal-growth vessel 23) in which the GaN substrate (substrate 1) was placed. The metallic Ga (solvent 3) was solid at room temperature (of approximately 25° C.), but was converted into a liquid (molten metallic Ga) by subsequent heating, and depth from the level of the molten metallic Ga (solvent 3) to the principal face $1m$ of the GaN substrate (substrate 1) was made 5 mm.

Next, 5 BN crucibles (crystal growth vessels 23) in which a GaN substrate (substrate 1) and metallic Ga (solvent 3) were housed were arranged in an inner vessel 21 in a stacked configuration.

Next, with a vacuum pump (evacuation pump 35), the insides of the inner vessel 21 and an outer vessel 29 were evacuated. Degree of vacuum in the inner vessel 21 and outer vessel 29 after the evacuation was $1 \times 10^{-3}$ Pa.

Successively, a nitrogen-containing gas 5 and pressurizing gas 7 were supplied respectively to the insides of the inner vessel 21 and outer vessel 29 so that internal pressures in the vessels were each brought to 1 MPa. In supplying the gases, as the nitrogen-containing gas 5 supplied to the inside of the inner vessel 21, a nitrogen gas of high purity with purity of 99.99999 mol % was utilized. On the other hand, as the pressurizing gas 7 supplied to the outer vessel 29, a nitrogen gas with purity of 99.9999 mol % was utilized.

Next, with a resistive heater 25, the insides of the inner vessel 21 and outer vessel 29 were heated to bring temperature in the entire interior of the inner vessel 21 to 975±5° C. As a result of the heating, the metallic Ga (solvent 3) fed into the inner vessel 21 was liquefied to cover the principal face $1m$ of the GaN substrate (substrate 1), and the nitrogen gas (nitrogen-containing gas 5) of high purity was dissolved into the liquefied metallic Ga, that was, the molten metallic Ga (solvent 3). In this manner, a solution in which the nitrogen gas (nitrogen-containing gas 5) of high purity was dissolved into the molten metallic Ga (solvent 3) could be made contact with the principal face $1m$ of the GaN substrate (substrate 1). During the heating, the nitrogen gas (nitrogen-containing gas 5) of high purity was further supplied to the inner vessel 21 to make internal pressure in the inner vessel 21 greater in the range of from 0.01 MPa to 0.1 MPa inclusive, compared with internal pressure in the outer vessel 29. That is, 0.01 MPa≦{(inner-vessel internal pressure)−(outer-vessel internal pressure)}≦0.1 MPa was established.

Subsequently, the amount of the nitrogen-containing gas 5 supplied to the inner vessel 21 and the amount of heating were adjusted. Specifically, with the temperature in the entire interior of the inner vessel 21 being kept at 975±5° C., the internal pressure in the inner vessel 21 was brought to 10 MPa to grow a GaN crystal (group III nitride crystal 10) onto the principal face $10m$ of the GaN substrate (substrate 1) for 3000 hours. In this growth, the amount of the nitrogen gas (pressurizing gas 7) supplied to the outer vessel 29 was adjusted to make the internal pressure in the outer vessel 29 lower in the range of from 0.01 MPa to 0.1 MPa inclusive, compared with the internal pressure in the inner vessel 21. That is, also in the crystal growth, as in the heating, it was established that 0.01 MPa≦{(inner-vessel internal pressure)−(outer-vessel internal pressure)}≦0.1 MPa.

Next, with the relationship of 0.01 MPa≦{(inner-vessel internal pressure)−(outer-vessel internal pressure)}≦0.1 MPa being maintained, the insides of the inner vessel 21 and outer vessel 29 were each cooled and depressurized to take out with tweezers the GaN crystal (group III nitride crystal 10) grown onto the GaN substrate (substrate 1) from the liquefied metallic Ga (solvent 3) in the BN crucible (crystal-growth vessel 27) in the inner vessel 21 cooled to 30° C. The grown GaN crystal had a thickness of 190 μm to 280 μm. That was, the GaN crystal growth rate was 0.0633 μm/hr to 0.0933 μm/hr.

Among 10 GaN crystals grown respectively onto the 10 GaN substrates ($5 \times 10^6 \text{ cm}^{-2} < D_s \leq 1 \times 10^7 \text{ cm}^{-2}$) of Comparative Example 1, all of them cracked. Furthermore, the average density $D_c$ of threading dislocation on crystal-growth planes after the GaN crystal growth measured $5 \times 10^6 \text{ cm}^{-2} < D_c \leq 1 \times 10^7 \text{ cm}^{-2}$ by the same method as in the measurement of the average density of threading dislocation on the substrate principal face. That is, in the present comparative example, threading dislocation density did not increase during the crystal growth. Herein, in the measurement of the average density $D_c$ of threading dislocation on the crystal-growth planes of the GaN crystals, the second square regions were each arranged so as to locate respectively right above the first square regions. The results are set forth in Table.

In contrast, among 10 GaN crystals grown respectively onto the 10 GaN substrates ($1 \times 10^6 \text{ cm}^{-2} < D_s \leq 5 \times 10^6 \text{ cm}^{-2}$) of Embodiment 1, the number of the cracked crystals was 4. Furthermore, average density $D_c$ of threading dislocation on crystal-growth planes after the GaN crystal growth was $1 \times 10^6 \text{ cm}^{-2} < D_c \leq 5 \times 10^6 \text{ cm}^{-2}$. That was, in the present embodiment, threading dislocation density did not increase during the crystal growth. The results are set forth in Table.

Additionally, among 10 GaN crystals grown respectively onto the 10 GaN substrates ($D_s \leq 1 \times 10^6 \text{ cm}^{-2}$) of Embodiment 2, there was no cracked crystal. Furthermore, average density $D_c$ of threading dislocation on crystal-growth planes after the GaN crystal growth was $D_c \leq 1 \times 10^6 \text{ cm}^{-2}$. That was, in the present embodiment, threading dislocation density did not increase during the crystal growth. The results are set forth in the table.

TABLE

|  | Comp. Ex. 1 | Embod. 1 | Embod. 2 |
| --- | --- | --- | --- |
| Threading dislocation avg. density $D_s$ (cm$^{-2}$) along GaN substrate principal face | $5 \times 10^6 < D_s \leq 1 \times 10^7$ | $1 \times 10^6 < D_s \leq 5 \times 10^6$ | $D_s \leq 1 \times 10^6$ |
| Threading dislocation avg. density $D_c$ (cm$^{-2}$) along GaN crystal-growth plane | $5 \times 10^6 < D_c \leq 1 \times 10^7$ | $1 \times 10^6 < D_c \leq 5 \times 10^6$ | $D_c \leq 1 \times 10^6$ |
| Cracking in GaN substrate and GaN crystal (plates/10 plates) | 10 | 4 | 0 |

As is clear from the table, it was found that in group III nitride crystal growth by a liquid-phase technique, employing substrates in which the average density of threading dislocation on their principal faces was $5\times10^6$ cm$^{-2}$ or less, preferably $1\times10^6$ cm$^{-2}$ or less curbed cracking in the substrates and cracking in the group III nitride crystals grown onto the substrates, leading to bulk group III nitride crystals.

It should be understood that in embodiment 1, when in the 10 substrates, dark-spot densities (threading dislocation densities) in 69 first 30 μm-square regions within the principal face of each of the substrates were measured by cathodoluminescence (CL), the number of the first square regions having more than 100 threading dislocations and the locations of the regions were wrote down, and in 6 substrates having no cracking in them and crystals grown onto them, relationship with the locations in which local cracking occurred in group III nitride crystals grown onto the substrates was studied. Second square regions located directly above the first square regions having more than 200 threading dislocations had more than 200 threading dislocations, and probability of local-cracking occurrence was a high approximately 80% (cracking occurred in 4 locations among 5 locations). Second square regions located directly above the first square regions having threading dislocations more than 100 to 200 or less had threading dislocations more than 100 to 200 or less, and probability of local cracking occurrence was a low approximately 13% (cracking occurred in 6 locations among 47 locations).

Furthermore, also in Embodiment 2, as in Embodiment 1, in the 10 substrates, the number of first square regions having more than 20 threading dislocations and the locations of the regions were wrote down, and in the 10 substrates having no breakage in them and crystals grown onto them, relationship with the locations in which local cracking occurred in the group III nitride crystals grown onto the substrates was studied. Second square regions located right above the first square regions having more than 50 threading dislocations had more than 50 threading dislocations, and local-cracking occurrence was confirmed (cracking occurred in 2 locations among 25 locations). On first square regions having threading dislocations more than 20 to 50 or less, however, no local-cracking occurrence was confirmed (no cracking occurred in all of 52 locations). Additionally, in 8 substrates, there was no breakage in them and crystals grown onto them, and no local cracking occurred. Furthermore, among the 8 substrates, in 2 substrates, no first square region having more than 50 threading dislocations was not confirmed.

The presently disclosed embodiments and implementation examples should in all respects be considered to be illustrative and not limiting. The scope of the present invention is set forth not by the foregoing description but by the scope of the patent claims, and is intended to include meanings equivalent to the scope of the patent claims and all modifications within the scope.

Group III nitride crystals produced by the growth methods involving the present invention are employed in substrates for devices including: light-emitting devices such as light-emitting diodes and laser diodes; electronic devices such as rectifiers, bipolar transistors, field-effect transistors, and high-electron-mobility transistors (HEMTs); semiconductor sensors such as temperature sensors, pressure sensors, radiation sensors, and visible-blind ultraviolet detectors; surface-acoustic-wave (SAW) devices; vibrators; resonators; oscillators; micro-electromechanical system (MEMS) parts; and piezoelectric actuators.

What is claimed is:

1. A method of growing group III nitride crystal by a liquid-phase technique, the group III nitride crystal growth method comprising:
    a step of preparing a freestanding substrate the entirety of which is formed from a group III nitride seed crystal having the same chemical composition as the group III nitride crystal to be grown, the substrate having a principal face and along the principal face an average density of threading dislocations of $5\times10^6$ cm$^{-2}$ or less, wherein the number of threading dislocations in an arbitrary first square region, 30 μm to a side, within the principal face is 200 or less; and
    step of bringing into contact with the substrate principal face a solution in which a nitrogen-containing gas is dissolved into a group III metal-containing solvent, to grow group III nitride crystal onto the principal face.

2. A group III nitride crystal growth method as set forth in claim 1, wherein in the group III nitride crystal growth step, the average density of threading dislocations along the crystal-growth plane of the group III nitride crystal is $5\times10^6$ cm$^{-2}$ or less.

3. A group III nitride crystal growth method as set forth in claim 2, wherein the number of threading dislocations in an arbitrary second square region, 30 μm to a side, within the crystal-growth plane of the group III nitride crystal is 200 or less.

4. A group III nitride crystal growth method as set forth in claim 3, wherein the number of threading dislocations in the second square region is 50 or less.

5. A group III nitride crystal growth method as set forth in claim 2, wherein the substrate is a freestanding substrate the entirety of which is formed from a group III nitride seed crystal.

6. A group III nitride crystal growth method as set forth in claim 2, wherein the principal face has an area of 1 cm$^2$ or more.

7. A group III nitride crystal growth method as set forth in claim 2, wherein the group III nitride crystal is GaN crystal.

8. A group III nitride crystal growth method as set forth in claim 7, wherein the group III metal-containing solvent is metallic Ga whose purity is 99 mass % or greater.

9. A group III nitride crystal growth method as set forth in claim 1, wherein the average density of threading dislocations along the principal face is $1\times10^6$ cm$^{-2}$ or less.

10. A group III nitride crystal growth method as set forth in claim 9, wherein in the group III nitride crystal growth step, the average density of threading dislocations along the crystal-growth plane of the group III nitride crystal is $1\times10^6$ cm$^{-2}$ or less.

11. A group III nitride crystal growth method as set forth in claim 1, wherein the number of threading dislocations in the first square region is 50 or less.

12. A group III nitride crystal growth method as set forth in claim 1, wherein the principal face has an area of 1 cm$^2$ or more.

13. A group III nitride crystal growth method as set forth in claim 1, wherein the group III nitride crystal is GaN crystal.

14. A group III nitride crystal growth method as set forth in claim 13, wherein the group III metal-containing solvent is metallic Ga with a purity of 99 mass % or greater.

* * * * *